United States Patent

Cuomo et al.

[11] Patent Number: 4,664,769
[45] Date of Patent: May 12, 1987

[54] PHOTOELECTRIC ENHANCED PLASMA GLOW DISCHARGE SYSTEM AND METHOD INCLUDING RADIATION MEANS

[75] Inventors: Jerome J. Cuomo, Lincolndale; Charles R. Guarnieri, Somers, both of N.Y.

[73] Assignee: International Business Machines Corporation, Armonk, N.Y.

[21] Appl. No.: 791,666

[22] Filed: Oct. 28, 1985

[51] Int. Cl.$^4$ .............................................. C23C 14/00
[52] U.S. Cl. ........................... 204/192.1; 204/192.11; 204/192.12; 204/192.31; 204/192.34; 204/298; 250/423 P; 250/425
[58] Field of Search .......................... 250/423 P, 425; 204/298, 192.1, 192.11, 192.12, 192.31, 192.34

[56] References Cited

U.S. PATENT DOCUMENTS

| | | | |
|---|---|---|---|
| 3,464,907 | 9/1969 | Froemel et al. | 204/192.11 |
| 3,625,848 | 12/1971 | Snaper | 204/192.11 |
| 3,723,246 | 2/1973 | Lubin | 176/1 |
| 3,826,996 | 7/1974 | Jaegle et al. | 331/94.5 |
| 3,898,496 | 8/1975 | Hudson | 204/192.11 |
| 4,152,625 | 5/1979 | Conrad | 315/111.7 |
| 4,189,686 | 2/1980 | Brau et al. | 331/94.5 |
| 4,243,887 | 1/1981 | Hillenkamp | 250/425 |
| 4,250,009 | 2/1981 | Cuomo et al. | 204/192.11 |
| 4,419,203 | 12/1983 | Harper et al. | 204/192.11 |
| 4,442,354 | 4/1984 | Hurst | 250/423 P |
| 4,490,229 | 12/1984 | Mirtich et al. | 204/192.11 |

OTHER PUBLICATIONS

Townsend, "Photon–Induced Sputtering"; Surface Science 90(1979) pp. 256–264.
Laser–Plasma Interactions for the Deposition and Etching of Thin–Film Materials P. J. Hargis, Jr. et al.—Solid State Technology Nov. 1984 pp. 127–133.
Plasma–Initiated Laser Deposition of Polycrystalline and Monocrystalline Silicon Films J. M. Gee et al., Mat. Res. Soc. Symp. Proc. vol. 29, (1984) published by Elsevier Science Publishing Co., Inc. pp. 15–20.
Laser–Induced Plasmas for Primary Ion Deposition of Epitaxial Ge and Si Films D. Lubben et al., J. Vac. Sci. Technol. B 3 (4) Jul/Aug. 1985 pp. 968–974.
Laser Photoelectron Sources of High Apparent Brightness Gail A. Massey IEEE Journal of Quantum Electronics vol. QE-20 No. 2 Feb. 1984 pp. 103–105.

Primary Examiner—Arthur P. Demers
Attorney, Agent, or Firm—John J. Goodwin

[57] ABSTRACT

Plasma enhancement is achieved in a plasma glow system by increasing the number of photoelectric electrons in the plasma glow by producing photoelectrons from the surface of a target in the system by the use of a radiation source. This is more particularly accomplished by flooding the surface of the target with a UV laser beam during the plasma process where emitted photoelectrons are injected into the plasma to increase the plasma density.

The plasma enhancement is used in a sputter etching-/deposition system which includes a chamber containing a cathode, a target, a substrate platform containing substrate and a pump. An ultraviolet light source such as a UV laser and focussing optics for focussing the UV radiation onto the target through a UV transmission window are also provided. A plasma region in the chamber is enhanced by photons from the laser striking the target and producing photoelectrons which are injected into the plasma to increase its density.

16 Claims, 2 Drawing Figures

PHOTOELECTRIC ENHANCED PLASMA GLOW DISCHARGE SYSTEM AND METHOD INCLUDING RADIATION MEANS

BACKGROUND OF THE INVENTION

1. Field of the Invention

The present invention relates to glow discharge systems and methods, and more particularly, to increasing the amount of electrons in the plasma glow region of a glow discharge system by radiation by photons such as by using a laser beam to enhance the intensity of the glow for improved etching/deposition processes.

2. Description of the Prior Art

The prior art contains references wherein radiation such as by laser beams are used in combination with plasmas for various diverse purposes.

U.S. Pat. No. 3,723,246 issued Mar. 27, 1973 to Lubin, entitled PLASMA PRODUCTION APPARATUS HAVING DROPLET PRODUCTION MEANS AND LASER PRE-PULSE MEANS describes an apparatus and method for producing a freely expanding high temperature plasma from a high density target that is irradiated with laser light by a tailored laser pulse. Means are described for producing a tailored laser light pulse and a tailored target for producing a laser-target interaction.

U.S. Pat. No. 3,826,996 issued July 30, 1974 to Jaegle et al entitled METHOD OF OBTAINING A MEDIUM HAVING A NEGATIVE ABSORPTION COEFFICIENT IN THE X-RAY AND ULTRAVIOLET SPECTRAL RANGE AND A LASER FOR PRACTICAL APPLICATION OF SAID METHOD, a plasma is formed from a material in which the ions possess discrete metastable energy states interacting with the energy states of the continuum which are populated by the free electrons of the plasma. Population inversion is achieved between a number of these metastable states and states of lower energy, negative absorption being then produced for the transition which couples the metastable states with said states of lower energy.

In order to form the plasma, a giant-pulse laser beam is caused to interact in vacuum with a solid target formed of said material and is focused within the target near the surface through which the beam passes, the beam power being such as to ensure sufficiently populated metastable states of the ions of the material.

U.S. Pat. No. 4,152,625 issued May 1, 1979 to Conrad, entitled PLASMA GENERATION AND CONFINEMENT WITH CONTINUOUS WAVE LASERS describes a method and apparatus for initiating a stable plasma and maintaining the plasma stationary. A high power, continuous wave laser is used to initiate and maintain the plasma, while a magnetic trap confines the plasma.

In U.S. Pat. No. 4,189,686 issued Feb. 19, 1980 to Brau et al entitled COMBINATION FREE ELECTRON AND GASEOUS LASER describes a multiple laser having one or more gaseous laser stages and one or more free electron stages. Each of the free electron laser stages is sequentially pumped by a microwave linear accelerator. Subsequently, the electron beam is directed through a gaseous laser, in the preferred embodiment, and in an alternative embodiment, through a microwave accelerator to lower the energy level of the electron beam to pump one or more gaseous lasers. The combination laser provides high pulse repetition frequencies, on the order of 1 kHz or greater, high power capability, high efficiency, and tunability in the synchronous production of multiple beams of coherent optical radiation.

The publication LASER-PLASMA INTERACTIONS FOR THE DEPOSITION AND ETCHING OF THIN-FILM MATERIALS by Philip J. Hargis, Jr. and James M. Gee, Solid State Technology/Nov. 1984, pp. 127–133, states that laser-plasma chemical processing is a new materials processing technique in which both ultraviolet laser irradiation and a glow discharge are required for deposition or etching. This versatile materials processing technique was used to deposit silicon and etch a number of insulators. The process was also used to deposit epitaxial silicon films on single-crystal silicon wafers. Deposited and etched films were characterized by laser Raman spectroscopy, transmission electron microscopy, and scanning electron microscopy. Results obtained to date have been interpreted in terms of a mechanism that involves interaction of the incident ultraviolet laser radiation with a plasma deposited absorbed layer on the substrate.

In an other publication by J. M. Gee, P. J. Hargis, Jr., M. J. Carr, D. R. Tallant and R. W. Light entitled PLASMA-INITIATED LASER DEPOSITION OF POLYCRYSTALLINE AND MONOCRYSTALLINE SILICON FILMS, Mat. Res. Soc. Symp. Vol. 29 (1984) published by Elsevier Science Publishing Co., Inc., the authors report a new method of silicon deposition using the interaction between the radiation from a pulsed-ultraviolet excimer laser and the plasma species produced in a glow discharge in silane ($SiH_4$). Examination of the deposited film by laser Raman spectroscopy and by transmission electron microscopy revealed that the morphology ranged from polycrystalline silicon at laser fluences of 0.13–0.17 $J/cm^2$ to epitaxial silicon at fluences of 0.4–0.6 $J/cm^2$. Growth rates of 100 nm/min for polycrystalline silicon and 30 nm/min for monocrystalline silicon were achieved.

The Hargis and Gee publication and Gee et al publication, referred to above, do not anticipate the present invention. Both of these papers cover the same work on photo enhanced chemical vapor deposition. Their work shows the laser radiation interacts with an absorbed layer deposited by the plasma. They also show the laser radiation does not interact with the plasma. The electron-hole plasma discussed in their paper exists in the deposited layers only. It is a change in the electronic distribution of the solid that drives a chemical reaction.

A very recent publication, LASER-INDUCED PLASMAS FOR PRIMARY ION DEPOSITION OR EPITAXIAL Ge AND SL FILMS (J. Vac. Sci. Technol. B. Jul./Aug., 1985, pp. 968–974) is also of interest but does not anticipate the present invention. Lubben et al use the material ablated by laser radiation to deposit a film. They discuss the generation of the neutral plasma caused by the interaction of the laser radiation with the ablated material. The present invention deals with the enhancement of a plasma by the generation of photoelectrons using UV radiation.

In the publication by Gail A. Massey entitled "Laser Photoelectron Sources of High Apparent Brightness", published in IEEE Journal of Quantum Electronics, Vol., QE20, No. 2, Feb. 1984, the author states that by focusing an ultraviolet laser beam to a small spot on an appropriately shaped cathode, one can obtain photoelectron beams of increased brightness. Such a continuous electron source may be useful in electron beam lithography and other applications.

SUMMARY OF THE INVENTION

An object of the present invention is to provide a method and structure to enhance the plasma density of a plasma glow region.

Another object of the present invention is to provide a method and structure to enhance the plasma density of a plasma glow region by producing photoelectrons from the surface of a target.

Another object of the present invention is to provide a method and structure to enhance the plasma density of a glow region by adding electrons to the glow by directing photons onto a target to release photoelectrons.

A further object of this invention is to provide a method and apparatus to produce photon energy directed onto a target surface to release electrons into a plasma glow.

Still another object of the present invention is to provide laser apparatus for directing laser radiation onto a target for releasing electrons into a plasma glow.

The foregoing and other objects, features and advantages of the invention will be apparent from the following more particular description of the invention as illustrated in the accompanying drawings.

DESCRIPTION OF THE INVENTION

The significant feature of the present invention is that a novel approach for increasing the plasma density of a glow region is accomplished by providing a means to impart energy to a target surface. The energy so introduced is transferred to the target material and causes electrons to be released and free to enter the plasma glow where they will in turn produce ions.

Glow discharge diode systems derive their primary electron source from secondary electrons due to ion, photon and electron bombardment of target surfaces. These electrons feed the glow region where they are accelerated producing ions which further amplify their numbers. Any processes that add electrons to the plasma glow region will enhance the intensity of the glow. For example, high secondary emission surfaces produce plasma densities that are much higher than materials with low secondary electron emission coefficients. Electron injection into plasmas form an independent electron source and will also increase the plasma density (i.e., triode sputtering.)

In the present invention, plasma enhancement is achieved by increasing the number of photoelectric electrons from the surface of a target by the use of a photon source whose energy is greater than the work function of the surface it is impinged upon. The number of electrons is a function of the intensity proportional to a function of the intensity of the light source. Therefore, the more intense the photon source, the more electrons will be emitted from the surface. Although other sources are applicable, a laser is an ideal source of photon due to its intensity and directivity. Thus, UV laser with wavelengths in the deep UV. This is accomplished by flooding the surface of the target with UV light during the plasma process where the photoinduced electrons will be injected into the plasma. This is shown in FIG. 1.

Figure 1:
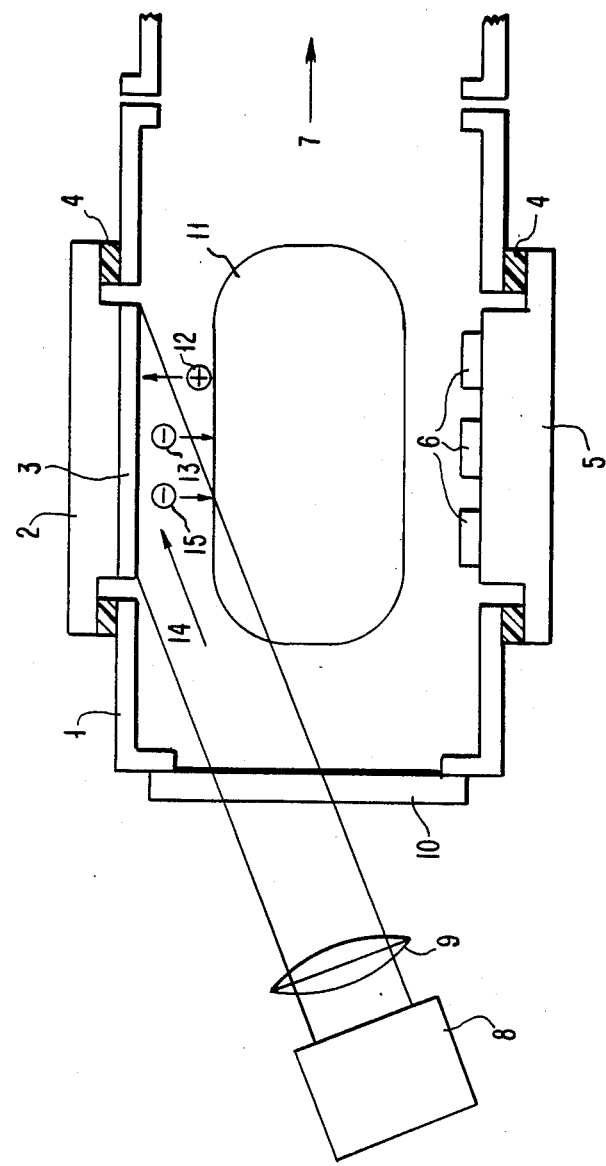
FIG. 1 is a schematic diagram of an embodiment of the structure according to the principles of the present invention.

Referring to FIG. 1, a sputtering system 1 is shown including a cathode 2, a target 3, an insulator 4 for the cathode 2, a substrate platform 5 containing substrate 6, a pump 7, an ultraviolet light source 8 such as a UV laser, focussing optics for focussing the UV radiation onto the target material through a UV transmissive window 10, a plasma region 11, a typical sputtering ion 12, a typical ion induced secondary electron, a typical UV photon and a typical photoelectron.

The sputtering system is operated in the same conventional manner as one skilled in sputtering would operate it to obtain the desired material properties. A substrate bias is used as required by material considerations. Sputtering gas is employed as required by material considerations, for example, Ar or a reactive gas such as oxygen or mixtures (includes all gases). Cathode power supply can be either dc or rf. With insulating targets the supply must be rf. In order to enhance the plasma, the energy of the photons provided by source 8 must be greater then the work function of the target 3 material. Some particular examples are:

| target material | photon energy greater than |
|---|---|
| Al | 4.4 eV |
| Cu | 4.9 eV |
| Cu <110> | 5.6 eV |
| Pt | 5.5 eV |
| Ti | 4.5 eV |
| oxides of Ti | 3.7 eV |
| oxides of Zr | 3.9 eV |

The invention is not limited to the above-listed materials and energies, however.

The electrons anticipated are about $1mA/cm^2$ per/10 ns pulses. This will produce an intense plasma enhancement. The calculated values are for an estimated efficiency of $10^{-4}$ electrons per incident 6.5 eV photon.

It should also be noted that this will produce an intense pulsed ion beam bombarding the target and a pulsed flux of material depositing on the substrate. With materials that generate negative ions, an intense pulsed particle beam is also expected. Thus, a patterned photon beam will produce pulsed patterned deposition or etching.

Figure 2:
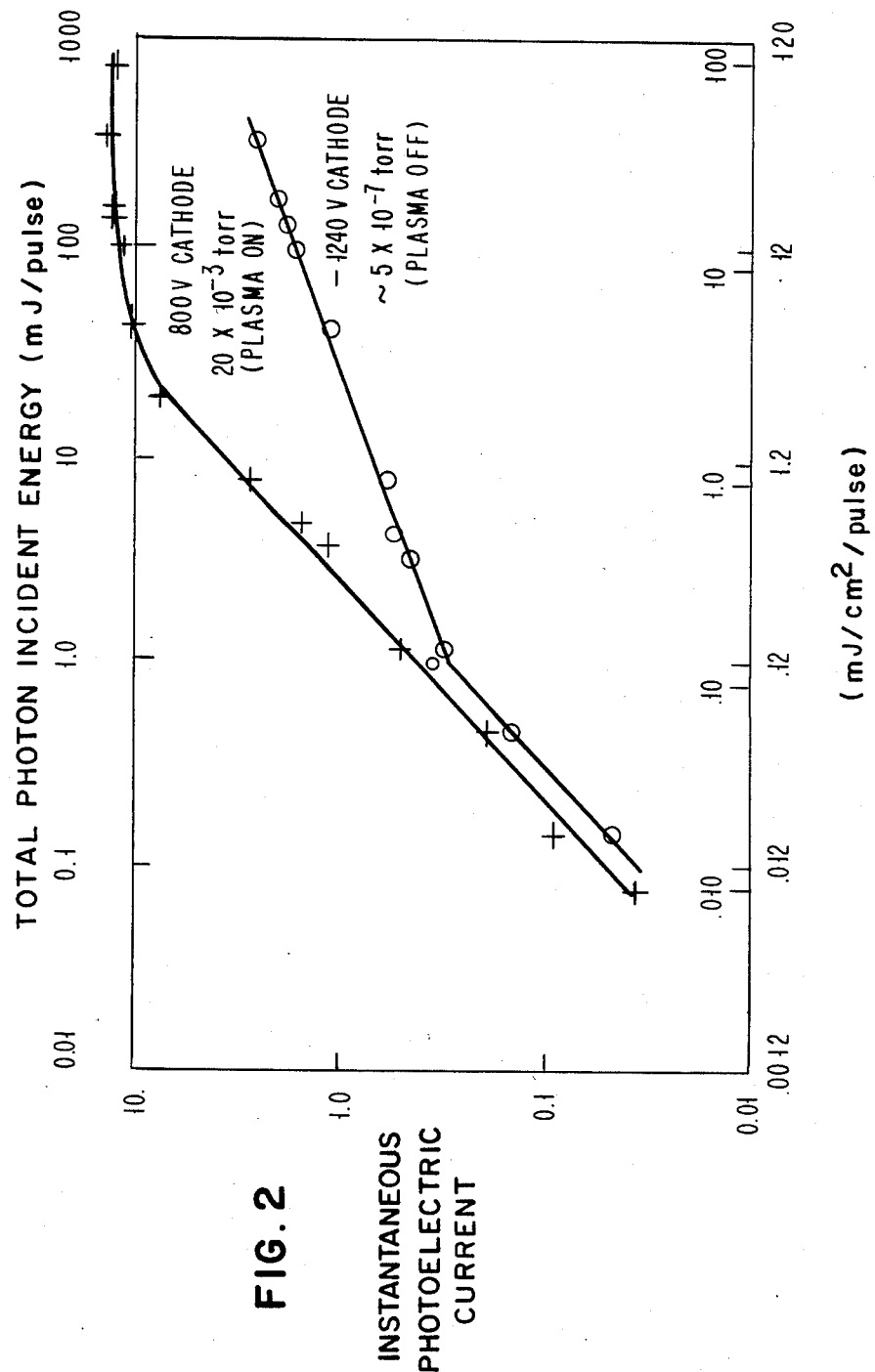
FIG. 2 is an illustration of a curve showing the relationship of photoelectric current within a plasma glow vs the photon intensity of the glow using the present invention.

Electron burst are obtainable that far exceed the calculated values, for example, current densities are realized of about 2 amps/cm². FIG. 2 shows the amplitude for the cathode current vs photon intensity (fluence) in a dc diode sputtering system. The measurements with and without a plasma are shown. In both cases, the current increases linearly with fluence until saturation (probably due to space charge) is reached. The discrepancy between experiment and calculated values could be attributed to an error in the estimated photoelectric efficiency or because the amplification effects due to plasma enhancements are dominant. The use of a high intensity, continuous UV light source will significantly increase the enhancement. It should be noted that the photoelectric current in the curves in FIG. 2 levels off for lower voltage, but does not level off for higher voltage. If the photoelectric current produced is plotted against time, it could be seen that the effect of the photon beam is not initially observed, but that after a given time period, the effects are noted. The shape or configuration of such curve over such time period is useful to one skilled in the art because it indicates the effects of the photoelectrons in the plasma.

It is important to note that althou9h the system of FIG. 1 used a UV laser beam, it is not the only embodiment that can be used. For example, it is not necessary that the means for producing the photons which are directed onto the surface of target 3, be located external to the system 1. The photon source may be an internally located UV source as well as an external source. The photon source may be a continuous (UV et al) source or a pulsed source. The particular embodiment selected by one skilled in the art would depend on the application of the system. The system can be widely employed for etching and for deposition. Also, as the photoelectrons are released from the target 3, they may have potentials of 1,000 eV and thus, move directly through ground potential plasma glow without scattering or dispersing.

Thus, if the photons were directed onto the largest surface 3 in a particular pattern, for example, through a laser mask, to produce a patterned photon beam, then the released photoelectrons would have the same configuration as they leave the target surface and the system could be used by one skilled in the art for patterning.

Still another feature of the invention is that non-linear photon effects may be obtained. This is achieved by selecting the energy of the radiation beam, for example the UV beam from laser 8 in FIG. 1, to be less than the work function of the irradiated target, such as target 3 of FIG. 1.

Having thus described our invention, what we claim as new and desire to secure by Letters Patent is:

1. In a plasma system of the type including a chamber containing plasma glow discharge, a means for adding electrons to said plasma to increase the intensity of said plasma glow discharge including a target, a source of photons directed onto said target for producing photo-induced photoelectrons which are emitted from said target and injected into said plasma.

2. A plasma system according to claim 1 wherein said system further includes a chamber containing said target, a substrate holder and substrates thereon subject to etching or deposition processing, and a sputtering gas in said chamber.

3. A plasma system according to claim 1 wherein said source of photons is a beam of electromagnetic radiation directed onto said target.

4. A plasma system according to claim 2 wherein said beam of electromagnetic radiation is an ultraviolet light source located within said chamber.

5. A plasma system according to claim 2 wherein said beam of electromagnetic radiation is an ultraviolet light source located external to said chamber.

6. A plasma system according to claim 3 wherein said ultraviolet light source is a continuous light source.

7. A plasma system according to claim 4 wherein said ultraviolet light source is a continuous light source.

8. A plasma system according to claim 3 wherein said ultraviolet light source is a pulsed light source.

9. A plasma system according to claim 4 wherein said ultraviolet light source is a pulsed light source.

10. A plasma system according to claim 6 wherein said ultraviolet light source is a laser.

11. A plasma system according to claim 2 wherein said beam of electromagnetic radiation is directed onto said target in a given image pattern, and wherein said photoelectrons are emitted from said target in a corresponding image pattern.

12. A method for enhancing the intensity of a plasma glow in a chamber by adding electrons to said plasma glow comprising:
    the step of forming a plasm glow region in said chamber using a glow discharge diode structure including a cathode and a target, and
    the step of directing ultraviolet radiation onto said target to generate photoelectrons which are injected into said plasma glow region to enhance the plasma density of said glow.

13. A method according to claim 12 wherein the step of directing ultraviolet radiation onto said target is carried out by directing a UV laser beam from a UV laser onto said target.

14. A method according to claim 12 wherein said chamber includes a specimen and said method includes the step of providing a sputtering gas in said chamber and said plasma glow functions to effect an etching or deposition process on said specimen.

15. A method according to claim 13 further including the step of forming said laser beam into a given pattern on said target.

16. A method according to claim 12 wherein the energy of said ultraviolet radiation is selected to be less than the work function of said target to provide non-linear multiphoton effects.

* * * * *